United States Patent
Pirozzi

(10) Patent No.: US 9,671,819 B2
(45) Date of Patent: Jun. 6, 2017

(54) DIGITAL FILTER WITH A PIPELINE STRUCTURE, AND A CORRESPONDING DEVICE

(71) Applicant: STMicroelectronics S.r.l., Agrate Brianza (IT)

(72) Inventor: Francesco Pirozzi, Gravina di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 70 days.

(21) Appl. No.: 14/730,408

(22) Filed: Jun. 4, 2015

(65) Prior Publication Data

US 2016/0011625 A1      Jan. 14, 2016

(30) Foreign Application Priority Data

Jul. 8, 2014   (IT) .............................. TO2014A0542

(51) Int. Cl.
  *G04F 1/04*      (2006.01)
  *G06F 1/08*      (2006.01)
  *G06F 15/76*     (2006.01)
  *H03H 17/02*     (2006.01)

(52) U.S. Cl.
  CPC ............... G06F 1/08 (2013.01); G06F 15/76 (2013.01); H03H 17/0292 (2013.01); H03H 2220/04 (2013.01)

(58) Field of Classification Search
  CPC .............. G06F 1/04; G06F 1/08; G06F 1/10
  USPC ......................... 713/500, 600, 503
  See application file for complete search history.

(56) References Cited

U.S. PATENT DOCUMENTS

| | | | | |
|---|---|---|---|---|
| 6,967,511 B1* | 11/2005 | Sullam | ..................... | G06F 1/10 327/144 |
| 6,990,598 B2* | 1/2006 | Sherburne, Jr. | ........ | G06F 1/3203 712/E9.063 |
| 7,451,334 B2* | 11/2008 | Chen | ......................... | G06F 1/32 713/322 |
| 8,208,594 B2* | 6/2012 | Villarino-Villa | ........ | H04L 1/205 327/147 |
| 8,842,847 B2* | 9/2014 | Geisler | .................... | G10H 1/06 381/118 |
| 2011/0103593 A1 | 5/2011 | Sutharsan | | |

(Continued)

OTHER PUBLICATIONS

Italian Search Report and Written Opinion for TO2014A000542 dated Feb. 25, 2015 (9 pages).

(Continued)

*Primary Examiner* — Chun Cao
(74) *Attorney, Agent, or Firm* — Gardere Wynne Sewell LLP

(57) ABSTRACT

A digital filter with a pipeline structure includes processing structures timed by respective clock signals. Each processing structure in turn is formed by a number of processing modules for processing input samples. A phase generator aligns the processing modules with the input samples so that each input sample is processed by a respective one of the processing modules. An up-sampling buffer and a down-sampling buffer are used when the processing structures operate at different clock frequencies (thus implementing different clock domains) so as to convert signal samples between the clock domains for processing in the processing structures.

21 Claims, 2 Drawing Sheets

(56) References Cited

U.S. PATENT DOCUMENTS

2015/0109156 A1* 4/2015 Wang .................. H03M 1/123
 341/141

OTHER PUBLICATIONS

Yong Ching Lim et al: "Pipeline Implementation of Recursive Filter," May 8, 1989; May 8, 1989, pp. 1548-1551, XP010084566.
Zhongnong Jiang et al: "A Pipelined/Interleaved IIR Digital Filter Architecture," IEEE International Conference on Acoustics, Speech, and Signal Processing, 1997, vol. 3, Apr. 21, 1997, pp. 2217-2220, XP010226379.

* cited by examiner

DIGITAL FILTER WITH A PIPELINE STRUCTURE, AND A CORRESPONDING DEVICE

PRIORITY CLAIM

This application claims priority from Italian Application for Patent No. TO2014A000542 filed Jul. 8, 2014, the disclosure of which is incorporated by reference.

TECHNICAL FIELD

The present disclosure relates to techniques of digital filtering with a pipeline structures. One or more embodiments may apply to devices for digital signal processing, such as DSP devices.

BACKGROUND

Digital signal processing (DSP) entails providing digital filters capable of meeting, in particular at a logic level, the specifications of precision and robustness linked to the applications envisaged.

This may involve a high occupation of area of silicon, with the consequenceS that derive therefrom both as regards to cost and to possible limitations in terms of performance that may adversely affect development of a product.

In order to reduce the effects in terms of area occupied by a processing chain such as a pipeline, instead of instantiating various copies of one and the same digital operator, some processing modules can be re-used. A given operator can thus be used for processing a sequence of operands organized according to a queue scheme in one the same time slot so as to keep performance in terms of throughput unaltered.

SUMMARY

In an embodiment, a structure for digital signal processing, for example, at the level of digital structures of a multiplex type, is implementation at the silicon level in a number of frequency domains and/or in a processing pipeline of a serialized type.

In an embodiment, a digital filter is provided with a pipeline structure.

One or more embodiments may also refer to a corresponding device (for example, a so-called digital signal processor or DSP).

In an embodiment, a digital filter with a pipeline structure includes a plurality of processing structures timed by respective clock signals. The digital filter includes: a plurality of processing structures each including plural processing modules for processing input samples, a phase generator configured to align said processing modules with said input samples so that each said input sample is processed by respective processing modules in said processing structures, and up-sampling and down-sampling buffers activatable when said processing structures operate at different clock frequencies. The digital filter includes at least one first clock domain and at least one second clock domain. The up-sampling and down-sampling buffers convert signal samples between said first clock domain and said second clock domain.

BRIEF DESCRIPTION OF THE FIGURES

One or more embodiments will now be described, purely by way of non-limiting example, with reference to the annexed figures, wherein.

DETAILED DESCRIPTION

Figure 1:
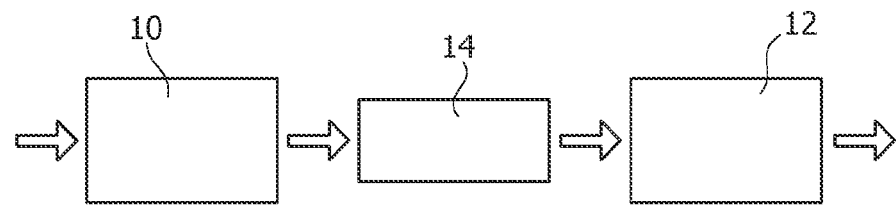
FIG. 1 is a block diagram representing the possible presence of a number of clock domains in a pipeline structure.

In the ensuing description, numerous specific details may be provided to enable an in-depth understanding of examples of embodiments. The embodiments may be implemented without one or more of the specific details, or with other methods, components, materials, etc. In other cases, well known structures, materials, or operations may not be represented or described in detail so that aspects of the embodiments will not be obscured. Any reference in the ensuing description to "an embodiment" or "one embodiment" means that a particular distinctive element, structure, or characteristic described with reference to the embodiment may be included in at least one embodiment. Hence, recurrence of the phrase "in an embodiment" or "in one embodiment" appearing in various points of the present description may not necessarily refer to one and the same embodiment. Furthermore, the particular distinctive elements, structures, or characteristics may be combined in any adequate way in one or more embodiments.

The headings and the references provided herein are merely provided for convenience and do not interpret the scope or the meaning of the embodiments.

Some pipeline schemes may envisage the use of serializer/de-serializer modules for multiplexing the input samples and de-multiplexing the outputs of a processing chain.

Such an approach may prove not particularly suitable for a DSP filtering pipeline, for example, considering the complex nature of digital filters. These may present in the form of operators with memory capacity, frequently operating at multiple frequencies, as occurs, for example, in metrology applications. These peculiarities lead to discarding the choice of providing digital infrastructures that may operate with these devices.

One or more embodiments may, instead, envisage operating in the framework of a number of structured clock domains, with the capacity of coordinating different logic structures in the various frequency domains and over serialized pipelines.

One or more embodiments may be used, for example, for implementing on semiconductor (silicon) digital-filtering pipelines that can be used, for example, for metrology applications.

As has already been said, "re-use" of a digital operator in the framework of a serialized line may prove difficult when the operator is a digital filter, considering its complex nature.

The foregoing is linked, for example, to the following factors:

these operators are operators with memory, in the sense that the result at the instant $t_n$ may depend both upon one or more inputs at the instant $t_n$ and upon one or more inputs distributed up to the instant $t_{n-k}$, where k is the order of the filter; in the case of IIR (Infinite Impulse Response) filters, the result at the instant $t_n$ may virtually depend upon all the inputs during the entire prior history of the filter;

frequently, these operators can operate at a number of frequencies, and the throughput of the pipeline may change from stage to stage, even within one and the same filtering block; and closed-loop implementations may be required (such as, for example, IIR filters), which may involve aspects of synchronization between low-frequency domains and high-frequency domains.

It is thus possible to hypothesize making use of one and the same filtering circuit, instantiated a number of times for implementing one and the same filtering function, applied to various input channels, in a parallel way. This approach may take into account the fact that the signals can change at each clock cycle according to the sampling frequency.

In this connection, it may again be noted that a solution based upon re-use of one and the same block for all the channels may not enable use of a buffer for storing the samples and processing them in a sequential way channel by channel. The reason for this is that the registers of the filtering chain may involve a settling time before the precision level specified is reached. If the registers are switched from the data of one channel to the data of another channel after a certain time window this time may be rather long in so far as the state of the filtering chain at a given instant can affect the results of processing of the subsequent samples. The fact of not re-setting the registers to their initial values (e.g., to zero) upon channel switching may prove useful in rendering the settling time shorter.

One or more embodiments may envisage that the above critical aspects are overcome by passing to structured clock domains with the capacity of coordinating different logic structures in the various frequency domains and over the serialized pipeline.

Such a concept is exemplified in the block diagram of FIG. 1, where the reference 10 designates a filtering module/function operating with a first clock signal CLOCK 1, while the reference 12 designates a second filtering module/function operating with a second clock signal CLOCK 2.

The reference 14 designates a re-sampling module/function that can functionally be set between the module/function 10 and the module/function 12 and can take into account the fact that the two clock signals CLOCK 1 and CLOCK 2 may be at a different frequency.

The re-sampling module/function 14 can operate in up-sampling or down-sampling mode, according to whether the working frequency CLOCK 2 of the second module/function 12 is higher or lower than the working frequency CLOCK 1 of the first module/function 10.

One or more embodiments that fall within the basic scheme of FIG. 1 may involve the use of just three digital structures, namely:

a clock generator that is able to supply the highest (higher) frequency (for example, the frequency CLOCK 1, assuming—purely by way of example—that this is higher than the frequency CLOCK 2) so as to process the samples in a serial way and keep the throughput unaltered;

a phase generator for providing the system of scheduling of the various samples in the serialized line as well as within the blocks that operate at different frequencies (CLOCK 1, CLOCK 2); and buffer memories (operating as up-sampling or down-sampling buffers) in the case where there are changes of the clock frequencies, so as to tune "fast" data with registers that operate in down-sampling mode and "slow" data with registers that operate in up-sampling mode, the reason being that the fast data "move towards" the down-sampling registers, the slow data "move towards" the up-sampling registers.

Figure 2:
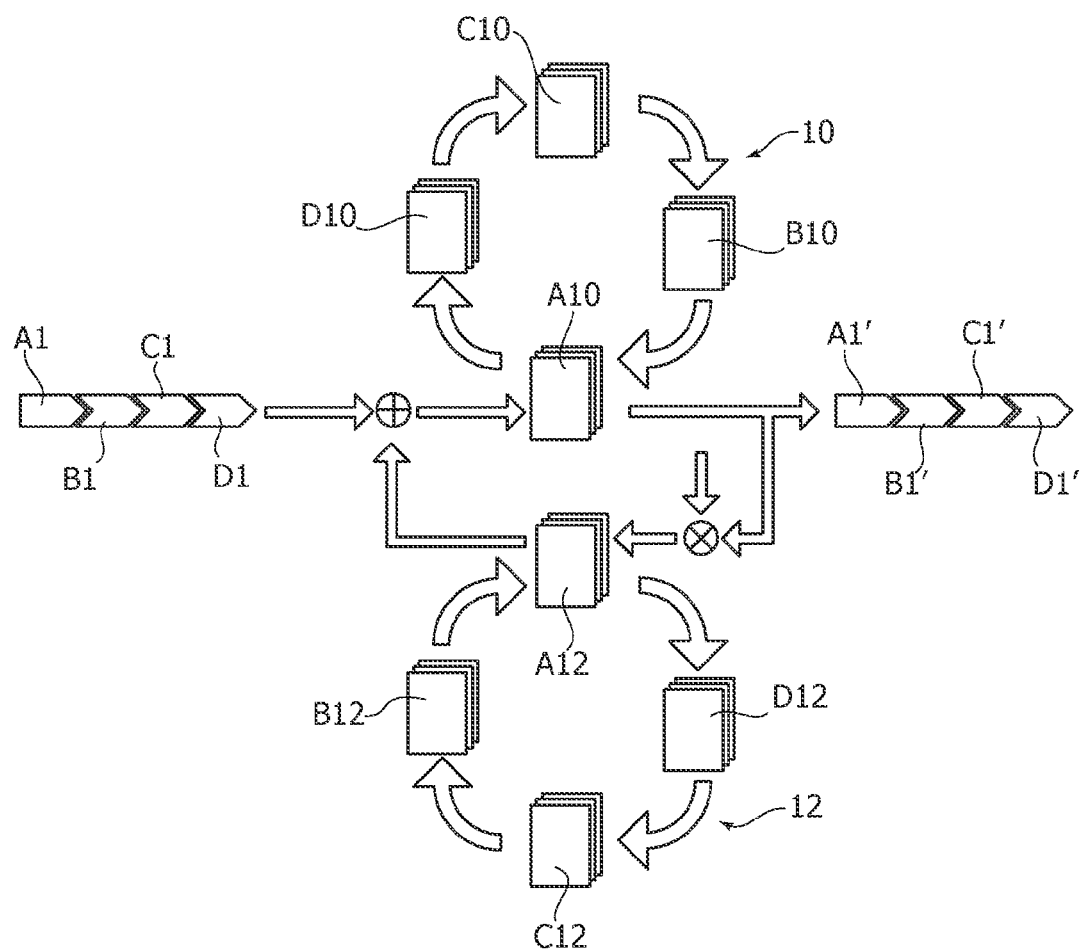
FIG. 2 is a functional block diagram of a filter structure operating with a single clock frequency.

The diagram of FIG. 2 refers to a working condition in which a filtering structure that processes input samples designated by A1, B1, C1, D1, etc. operates at a single frequency, hence without requiring intervention of buffers, with the entire system controlled by a phase generator (not explicitly illustrated in the figure for simplicity of representation), which "rotates" the memory structures 10 (modules A10, B10, C10, D10) and memory structures 12 (modules A12, B12, C12, D12) so as to align them with the corresponding input samples according to the processing requirements.

With a representation that is deliberately simplified for facilitating understanding and with reference—in a non-limiting way—to a pipeline that implements an IIR filter, assuming that the input samples are identified with A1, B1, C1, D1, etc. the rotation of the memory structures 10, 12 will entail, for example, that:

the input sample A1 is filtered with the modules A10, A12 for supplying at output a sample A1';

the input sample B1 is filtered with the modules B10, B12 for supplying at output a sample B1';

the input sample C1 is filtered with the modules C10, C12 for supplying at output a sample C1'; and the input sample D1 is filtered with the modules D10, D12 for supplying at output a sample D1'.

Figure 3:
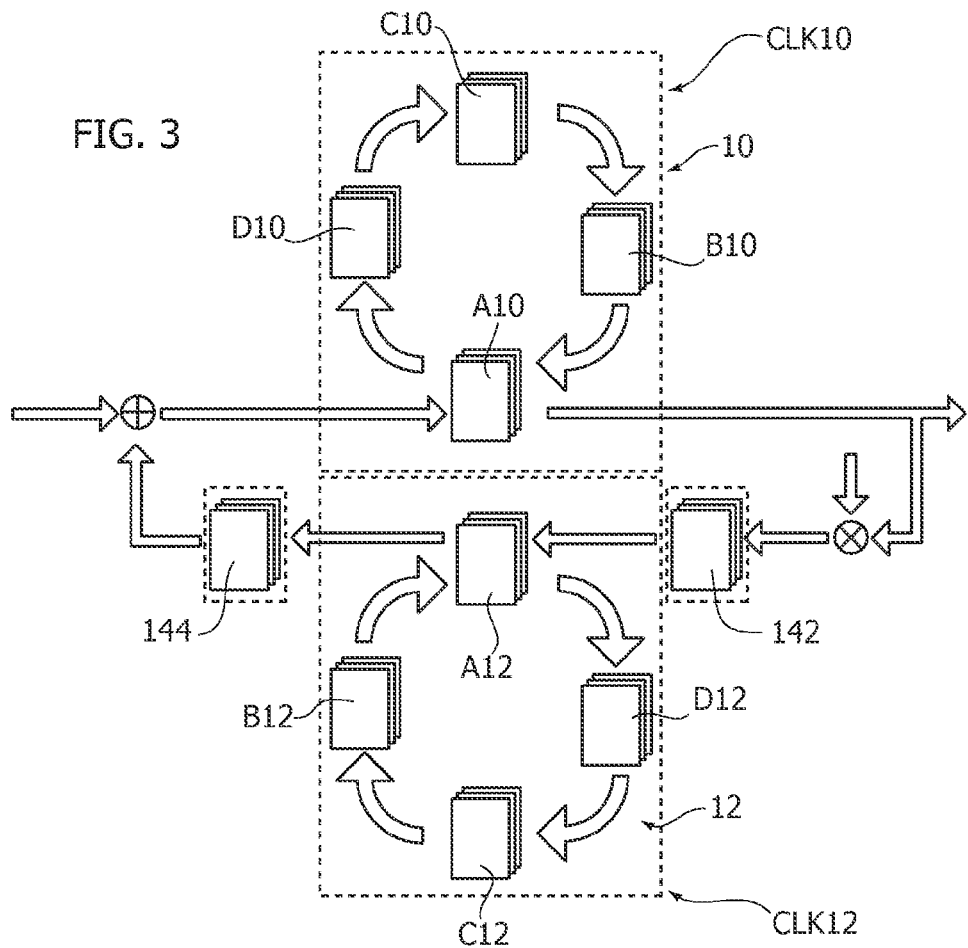
FIG. 3 is a functional block diagram representing a digital filter operating with a number of clock frequencies.

The diagram of FIG. 3 exemplifies the fact that a structure according to one or more embodiments can operate with clocks that time the operation (rotation) of the structures 10 and 12 with different frequencies, e.g., with a "fast" clock CLK10 and a "slow" clock CLK12. Along with this there is envisaged, in one or more embodiments, insertion of buffers 142 and 144. Assuming—by way of example—that the clock frequency CLK12 is lower than the clock frequency CLK10, the above buffers may be a down-sampling buffer 142, for "slowing down" the data supplied to the structure 12 that operates at a lower frequency, and of an up-sampling buffer 144, that is to bring back the samples at output from the structure 12, operating at a lower frequency, to the higher-frequency clock, at which the structure 10 operates.

It will be appreciated that, in one or more, embodiments the buffers in question may not require the presence of further circuits designed for their control. These buffers may in fact operate according to the same rotation scheme used for the other memory structures as a function of the clocks of the two domains represented by the structures 10 and 12.

In one or more embodiments, in order to render the data stable with a view to sampling by the "slow" clock domain (CLK12, in the example considered herein), it may be envisaged that the data of the buffer 142 are sampled just prior to the leading edge of the "slow" clock signal.

Once again in one or more embodiments, the buffer 142 of a down-sampling type may be such as not to enable any effective processing, limiting its action to cause "rotation" of its output with the "slow" clock signal so as to offer the correct data with a view to sampling by the logic of the part of circuit operating at a lower frequency (structure 12, in the example illustrated herein). In one or more embodiments, to the slow circuit there may in fact be entrusted just the task of taking the fast samples in the right order, which—without the use of the buffer—might not be the right one on account of the frequency ratio between the two clock domains, which cannot be determined beforehand.

Figure 4:
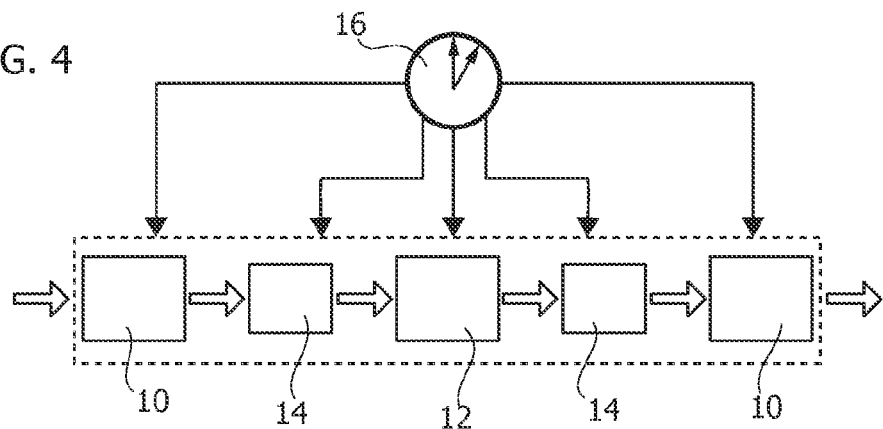
FIG. 4 is a block diagram representing the possibility, in one or more embodiments, of using a centralized phase generator.
Figure 5:
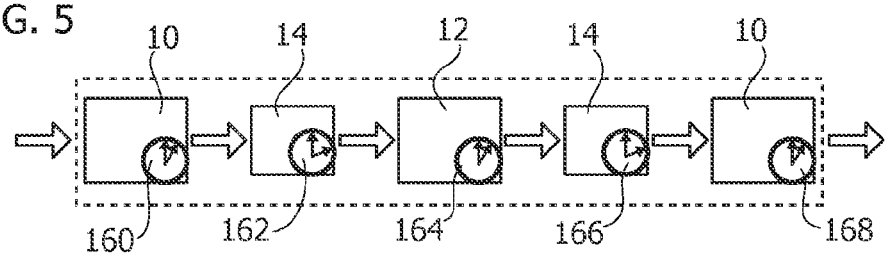
FIG. 5 is a block diagram representing the possibility, in one or more embodiments, of using a distributed phase generator.

FIGS. 4 and 5 (where the formalism is once again the general one represented in FIG. 1) exemplify the possibility, in one or more embodiments, of using—instead of a centralized phase-generation module/function 16, i.e., that is to distribute the phase-rotation signals over the entire device (FIG. 4)—a "distributed" phase-rotation system that can vary from block to block according to the different latency introduced by each block in the pipeline (FIG. 5). In fact, in a given time slot a subsequent block may not be in a condition to sample data on one and the same channel from a block that precedes it if the latency introduced over the path is not a multiple of the total number of channels. In this case, blocks with different latencies arranged on one and the same pipeline can be timed by different phase-rotation systems.

When the latency distribution in the pipeline may be considerable, an efficient solution may be to supply to the various blocks, instead of a general clock signal 16 (e.g., locked to the "faster" clock CLK10), respective dedicated phase signals (e.g., 160, 162, 164, 166, 168, etc.) with a mechanism whereby the dedicated phase signal is supplied to the subsequent block together with the serialized data, as represented schematically in FIG. 5.

In this way, each block can be enabled to process the channel data that are supplied to it irrespective of the position that they occupy in the serialized stream.

In this way, it is possible to achieve also a greater flexibility as regards re-use of the functionalities (IPs) of the block. These can in fact be shifted forwards or backwards in a new pipeline independently of whether interconnection with respect to the previous and subsequent blocks is correct.

Of course, without prejudice to the underlying principles, the details of construction and the embodiments may vary, even significantly, with respect to what is illustrated herein purely by way of non-limiting example, without thereby departing from the extent of protection.

The invention claimed is:

1. A digital filter, comprising:
  a pipeline structure including a plurality of processing structures each timed by a respective clock signal, wherein each processing structure includes plural processing modules for processing input samples,
  a phase generator configured to align said processing modules to said input samples so that each said input sample is processed by a respective one of the processing modules in said processing structures,
  up-sampling and down-sampling buffers configured to be activated when the clock signals for timing said processing structures operate at different clock frequencies to define a first clock domain and a second clock domain,
  said up-sampling and down-sampling buffers configured to convert signal samples between said first clock domain and said second clock domain.

2. The filter of claim 1, wherein said phase generator is a centralized phase generator configured to distribute a phase alignment signal across the processing modules of said processing structures.

3. The filter of claim 1, wherein said phase generator is a distributed phase generator, each processing module being provided with a dedicated phase alignment signal to be fed to a subsequent processing module along with the serialized data in the pipeline structure.

4. The filter of any claim 1, further including a clock generator configured to deliver a higher clock frequency of said different clock frequencies to manage serial processing of said input samples.

5. The filter of claim 1, wherein said filter is a IIR filter.

6. The filter of claim 1, implemented as a digital signal processor.

7. A filter, comprising:
  a first processing structure operating in accordance with a first clock and including a plurality of first processing modules arranged in a first rotating processing scheme timed by said first clock;
  a second processing structure operating in accordance with a second clock, wherein the second clock has a lower frequency than the first clock, and including a plurality of second processing modules arranged in a second rotating processing scheme timed by said second clock;
  a down-sampling buffer configured to receive first input data at the first clock and output first output data at the second clock for processing through the second processing structure; and
  an up-sampling buffer configured to receive second input data output from the second processing structure at the second clock and output second output data at the first clock.

8. The filter of claim 7, wherein the first input data is derived from data output from the first processing structure.

9. The filter of claim 7, wherein data input to the first processing structure is derived from the second output data.

10. The filter of claim 7, further comprising a phase generator configured to align said first and second processing modules to data samples so that each input sample is processed by a respective one of the first and second processing modules.

11. The filter of claim 10, wherein said phase generator is a centralized phase generator configured to distribute a phase alignment signal across the processing modules of said processing structures.

12. The filter of claim 10, wherein said phase generator is a distributed phase generator, each processing module being provided with a dedicated phase alignment signal to be fed to a subsequent processing module.

13. The filter of claim 7, wherein the first and second processing structures are arranged in a pipeline structure.

14. The filter of claim 7, wherein said filter is a IIR filter.

15. The filter of claim 7, implemented as a digital signal processor.

16. A digital filter, comprising:
  a pipeline structure including a first processing structure operating within a first clock domain in response to a first clock signal at a first clock frequency and a second processing structure operating within a second clock domain in response to a second clock signal at a second clock frequency, wherein each of the first and second processing structures includes plural processing modules for processing input samples,
  a phase generator configured to align said processing modules to said input samples so that each said input sample is processed by a respective one of the processing modules in said first and second processing structures,
  up-sampling and down-sampling buffers configured to be activated when the first and second clock frequencies are different clock frequencies, said up-sampling and down-sampling buffers configured to convert signal samples between said first clock domain and said second clock domain.

17. The filter of claim 16, wherein said phase generator is a centralized phase generator configured to distribute a phase alignment signal across the processing modules of said first and second processing structures.

18. The filter of claim 16, wherein said phase generator is a distributed phase generator, each processing module being provided with a dedicated phase alignment signal to be fed to a subsequent processing module along with the serialized data in the pipeline structure.

19. The filter of any claim 16, further including a clock generator configured to deliver a higher clock frequency of said first and second clock frequencies to manage serial processing of said input samples.

20. The filter of claim 16, wherein said filter is a IIR filter.

21. The filter of claim 16, implemented as a digital signal processor.

* * * * *